(12) United States Patent
Lai

(10) Patent No.: US 8,592,262 B2
(45) Date of Patent: Nov. 26, 2013

(54) RESIDUE ISOLATION PROCESS IN TFT LCD FABRICATION

(75) Inventor: Han-Chung Lai, Hsin-Chu (TW)

(73) Assignee: AU Optronics Corporation, Hsinchu (TW)

( * ) Notice: Subject to any disclaimer, the term of this patent is extended or adjusted under 35 U.S.C. 154(b) by 1639 days.

(21) Appl. No.: 11/601,229

(22) Filed: Nov. 16, 2006

(65) Prior Publication Data

US 2008/0118994 A1    May 22, 2008

(51) Int. Cl.
*H01L 21/336* (2006.01)

(52) U.S. Cl.
USPC .............. 438/151; 438/155; 438/30; 438/4; 257/E29.273

(58) Field of Classification Search
USPC ............ 438/149, 4, 151, 155, 30; 257/59, 66, 257/72, E29.273; 349/139–141
See application file for complete search history.

(56) References Cited

U.S. PATENT DOCUMENTS

| | | | | |
|---|---|---|---|---|
| 2,250,985 | A * | 7/1941 | Benson | 254/275 |
| 5,366,914 | A * | 11/1994 | Takahashi et al. | 438/270 |
| 5,434,686 | A * | 7/1995 | Kanemori et al. | 349/55 |
| 5,546,207 | A * | 8/1996 | Kim | 349/122 |
| 5,915,172 | A * | 6/1999 | Noumi et al. | 438/151 |
| 6,025,892 | A * | 2/2000 | Kawai et al. | 349/43 |
| 6,395,586 | B1 * | 5/2002 | Huang et al. | 438/149 |
| 6,531,392 | B2 * | 3/2003 | Song et al. | 438/648 |
| 6,856,374 | B1 * | 2/2005 | Ozaki et al. | 349/192 |
| 6,876,404 | B2 * | 4/2005 | Park et al. | 349/38 |
| 6,992,747 | B2 * | 1/2006 | Chen | 349/192 |
| 7,209,194 | B2 * | 4/2007 | Suzuki et al. | 349/55 |
| 7,283,183 | B2 * | 10/2007 | Liu et al. | 349/54 |
| 7,428,032 | B2 * | 9/2008 | Yoo et al. | 349/138 |
| 7,436,461 | B2 * | 10/2008 | Choi et al. | 349/42 |
| 7,518,666 | B2 * | 4/2009 | Jung et al. | 349/43 |
| 7,714,948 | B2 * | 5/2010 | Yagi et al. | 349/38 |
| 7,750,985 | B2 * | 7/2010 | Su | 349/38 |
| 2002/0093016 | A1 * | 7/2002 | Lim et al. | 257/59 |
| 2002/0171083 | A1 | 11/2002 | Lim et al. | 257/59 |
| 2003/0020134 | A1 * | 1/2003 | Werner et al. | 257/471 |
| 2003/0081164 | A1 * | 5/2003 | Sato et al. | 349/141 |

(Continued)

FOREIGN PATENT DOCUMENTS

| | | |
|---|---|---|
| JP | 2008-234236 | 9/1996 |
| JP | 2009-258244 | 10/1997 |
| JP | 2005-346090 | 12/2005 |

OTHER PUBLICATIONS

Japanese Office Action of this U.S. Appl. No. 11/601,229's corresponding Japanese patent application which was mailed on May 6, 2011.

*Primary Examiner* — Matthew W Such
*Assistant Examiner* — Ali Naraghi

(57) ABSTRACT

A method is used to prevent unwanted electrical contacts between various electrically conducting surfaces and lines in a display panel due to an n+ a-Si residue and/or ITO debris. The method provides a clearing pattern including at least a cleared area in the passivation layer for preventing the residue or debris from locating at the cleared area. As such, if an n+ a-Si residue happens to be deposited under the passivation layer, the part of the residue located in the cleared area is removed by an a-Si selective etching process, for example. Furthermore, with the cleared area, ITO debris deposited on the section of the dielectric layer deposited on the signal line can be electrically isolated from the electrode.

25 Claims, 14 Drawing Sheets

(56) References Cited

U.S. PATENT DOCUMENTS

| | | | |
|---|---|---|---|
| 2004/0041959 A1* | 3/2004 | Yoo et al. | 349/43 |
| 2004/0043545 A1* | 3/2004 | Yoo et al. | 438/149 |
| 2004/0222419 A1* | 11/2004 | Matsui et al. | 257/59 |
| 2005/0116915 A1* | 6/2005 | Nakajima et al. | 345/93 |
| 2005/0174501 A1* | 8/2005 | Yoo et al. | 349/43 |
| 2005/0259190 A1* | 11/2005 | Wang et al. | 349/38 |
| 2006/0028592 A1* | 2/2006 | Lai | 349/42 |
| 2006/0040435 A1* | 2/2006 | Morisue et al. | 438/151 |
| 2006/0189054 A1* | 8/2006 | Kim et al. | 438/197 |
| 2007/0024786 A1* | 2/2007 | Tanaka et al. | 349/139 |
| 2007/0075961 A1* | 4/2007 | Shyu et al. | 345/98 |
| 2007/0165180 A1* | 7/2007 | Cho | 349/187 |
| 2007/0231974 A1* | 10/2007 | Chiu et al. | 438/149 |
| 2009/0073335 A1* | 3/2009 | Yagi et al. | 349/39 |

* cited by examiner

RESIDUE ISOLATION PROCESS IN TFT LCD FABRICATION

FIELD OF THE INVENTION

The present invention relates generally to TFT LCD fabrication processes and, more particularly, to a process for clearing and isolating residues in the LCD panel.

BACKGROUND OF THE INVENTION

Thin-film transistor (TFT) liquid crystal display (LCD) panels are known in the art. Typically, an LCD panel comprises an upper substrate, a lower substrate and a liquid crystal layer disposed between the upper and lower substrates, as shown in FIG. 1a. The upper substrate typically comprises a common electrode layer and a color filter layer. The lower substrate comprises a plurality of pixel electrodes to define the pixels of the LCD panel. In each pixel, the lower substrate comprises various electronic components such as one or more thin-film transistors (TFTs), one or more capacitors, at least one gate line, and at least one data line. FIG. 1b shows part of the lower substrate in a pixel and FIGS. 2A-2G illustrate the process steps of fabricating a TFT. As shown in FIG. 1b, a gate metal layer and a capacitor metal layer are separately deposited on a glass substrate, and a dielectric layer made of $SiN_x$ or the like is deposited over the metal layers (part of these layers are shown in FIGS. 2A and 2B). On the TFT, an amorphous silicon layer (a-Si:H) and a doped amorphous silicon layer (n+ a-Si:H) are deposited above the gate structure, as shown in FIG. 2C. A source/drain metal layer is deposited over the a-Si layers, as shown in FIG. 2D. A back-channel etching (BCE) step is used to define the source electrode and a drain electrode, as shown in FIG. 2E. A passivation layer made of $SiN_x$ or the like is deposited over the transistor structure, exposing a section of the drain electrode (FIG. 2F) so that the drain electrode can make electrical contact with a pixel electrode made of indium tin oxide (ITO), as shown in FIG. 2G. Apart from the TFT, the capacitor metal layer, the dielectric layer and the ITO layer form a storage capacitor for the pixel (see FIG. 1b). During one of the process steps, a metal layer is deposited on the dielectric layer to form a data line (see FIG. 1b).

This BCE process also removes part of the n+ a-Si:H and a-Si:H layers. If some of the n+ a-Si:H residues land between the gate or data line and pixel electrode (see FIG. 3), the pixel may become defective. FIG. 3 is a schematic representation showing a plan view of two adjacent pixels in an LCD panel. As shown in FIG. 3, a pixel is substantially defined by two adjacent gate lines and two adjacent data lines. A common line is typically provided in the middle of a row of pixels.

It is desirable and advantageous to provide a method to clear the n+ a-Si:H residues so as to improve the yield of LCD manufacturing.

Furthermore, when the ITO layer is deposited, some residues may also land between the gate or data line and the pixel electrode (see FIG. 6), and thus the pixel may also become defective. It is also desirable to provide a method to clear these ITO residues.

SUMMARY OF THE INVENTION

The present invention provides a method for preventing unwanted electrical contacts between various electrically conducting surfaces and lines in a display panel due to an n+ a-Si residue and/or ITO debris. The present invention provides a clearing pattern which includes at least a cleared area in the passivation layer for preventing the residue or debris from locating at the cleared area. As such, if an n+ a-Si residue happens to be deposited under the passivation layer, the part of the residue located in the cleared area is removed by an a-Si selective etching process, for example. Furthermore, with the cleared area, ITO debris deposited on the section of the dielectric layer deposited on the signal line can be electrically isolated from the electrode.

Thus, the first aspect of the present invention is a method for preventing an unwanted electrical contact in a display panel due to an unwanted electrically conductive segment, wherein the display panel has a substrate and a plurality of pixels formed on the substrate, and wherein each of the pixels comprises a passivation layer and a pixel electrode disposed on a section of the passivation layer. The method comprises using a clearing process to create a clearing pattern in at least some of the pixels, the clearing pattern including at least a cleared area in the passivation layer for preventing the unwanted electrically conductive segment from locating at the cleared area.

When the unwanted electrically conductive segment comprises a doped amorphous silicon segment located under the passivation layer, the clearing process comprises etching away at least part the doped amorphous silicon segment located in the cleared area. It is advantageous to use an agent that is effective against the passivation layer but substantially less effective against the doped amorphous silicon in removing the passivation layer in the cleared area, before etching away the doped amorphous silicon segment located in the cleared area using a selective etching agent.

When the pixel further comprises a signal line, such as a data line or gate line, disposed between the doped amorphous silicon segment and the passivation layer, the cleared area is dimensioned to prevent the unwanted electrical contact between the electrode and the signal line through the doped amorphous silicon segment.

When the unwanted electrically conductive segment comprises an electrically conductive layer deposited on the passivation layer, the cleared area is dimensioned to prevent the electrically conductive layer from forming a continuous layer over the cleared area.

It is known that the pixel further comprises a dielectric layer disposed between the substrate and the passivation layer, the method also provides one or more strips of amorphous silicon between the passivation layer and the dielectric layer, the strips are dimensioned such that the cleared area exposes only a first section of the strips of amorphous silicon, leaving a second section under the passivation layer; and removes the first section and at least a part of the second section of the strips of amorphous silicon, using an etching agent effective against the amorphous silicon and substantially less effective against the passivation layer and the dielectric layer.

The second aspect of the present invention is a process of fabricating a display panel, the display panel having a substrate and a plurality of pixels. The process comprises:

providing, in each pixel, a first dielectric layer on the substrate;

disposing a signal line on the first dielectric layer;

disposing a second dielectric layer on the substrate covering the signal line;

clearing an area on the second dielectric layer and a least a part of the first dielectric layer, the cleared area separating a first section of the second dielectric layer and a second section of the second dielectric layer, wherein the first section covers the signal line; and disposing a pixel electrode on at least part of the second section of the second dielectric layer.

In another embodiment of the present invention, the process also provides one or more strips of amorphous silicon between the first and second dielectric layers adjacent to the signal line, wherein the strips are dimensioned such that the cleared area exposes only a first part of the strips of amorphous silicon and leaves a second part under the passivation layer, and removes the first part and at least a part of the second part of the strips of amorphous silicon.

In yet another embodiment of the present invention, the process also provides one or more electrically conductive segments between the substrate and the first dielectric layer; and disposes one or more strips of amorphous silicon between the first and second dielectric layers over the electrically conductive segments, wherein each of the strips is dimensioned to cover the underlying electrically conductive segment, and the cleared area is wider than each of the strips so as to allow said clearing removing said at least part of the first dielectric layer.

The third aspect of the present invention is a display panel, such as a liquid crystal display panel, which comprises:
a substrate, and
a plurality of pixels formed on the substrate, each of the pixels comprising
a first dielectric layer;
a signal line disposed on the first dielectric layer;
a second dielectric layer disposed on the signal line and part of the first dielectric layer;
a pixel electrode disposed on part of the second dielectric layer, and
a clearing pattern provided in at least some of the pixels, wherein the clearing pattern includes at least a cleared area to clear part of the second dielectric layer for separating a first section of the second dielectric layer covering the signal line from a second section of the second dielectric layer on which the pixel electrode is disposed.

When each of the pixels further comprises one or more electrically conductive segments between the substrate and the first dielectric layer; the clearing pattern also includes removed areas in the first dielectric layer on both sides of each electrically conductive segment, and wherein the removed areas in the first dielectric layer are located within the cleared area.

DETAILED DESCRIPTION OF THE INVENTION

The residue and debris clearing and isolating process, according to the present invention, comprises the steps of etching one or more passivation layers and dielectric layers in order to create cleared areas on the substrate. Passivation and dielectric layers are typically made of $SiN_x$ or the like. As shown in FIGS. 1b and 2B-2G, dielectric layers are typically deposited over the substrate after metal strips for the gate structure and capacitors are disposed on the substrate. These dielectric layers are hereafter referred to as gate-dielectric layers or G-SiN layers. Passivation layers are typically deposited over the source/drain electrodes of a TFT. These layers are hereafter referred to as P-SiN layers.

Figure 4:
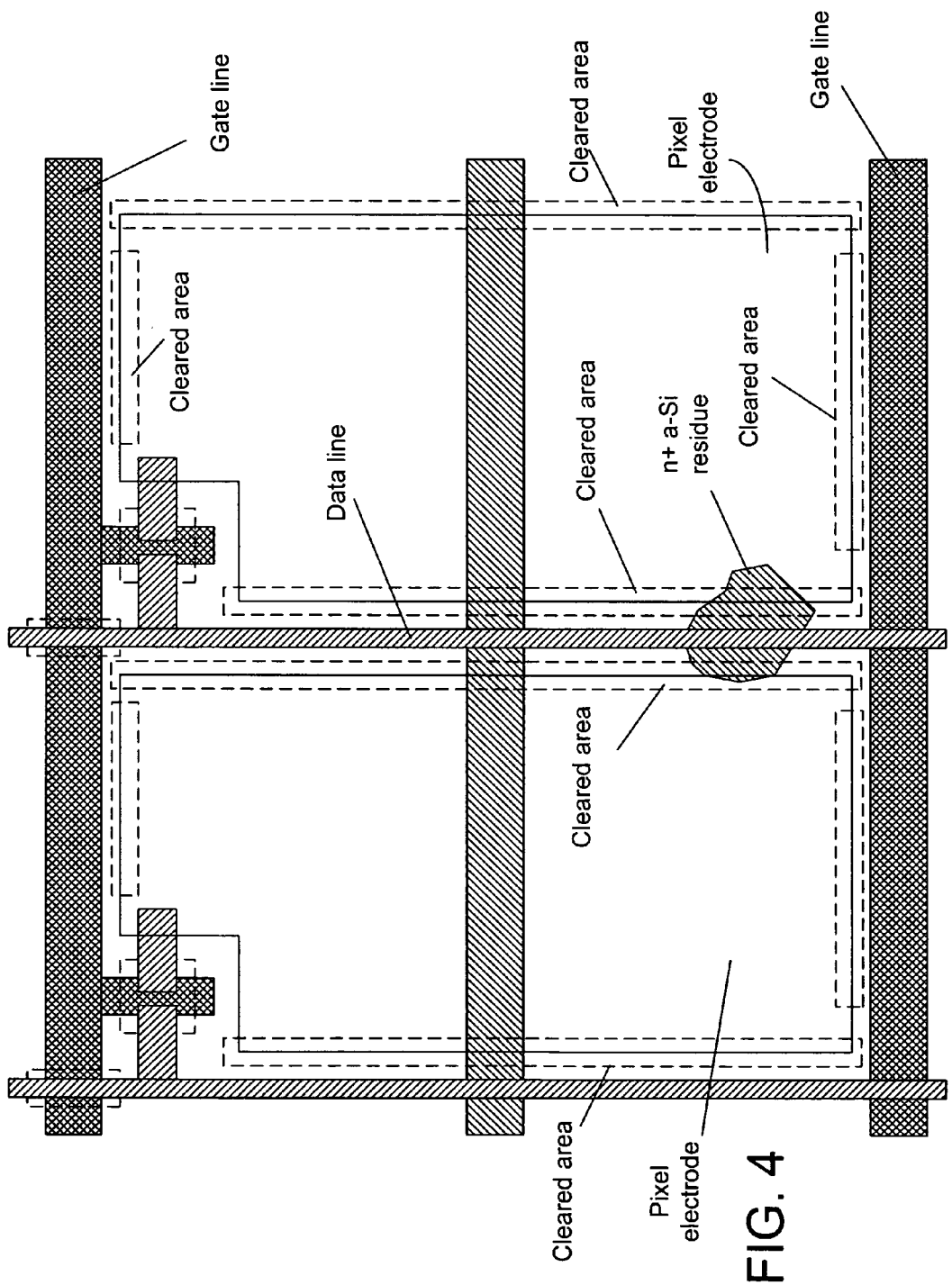
FIG. 4 illustrates one of the residue clearing processes, according to the present invention.
Figure 5:
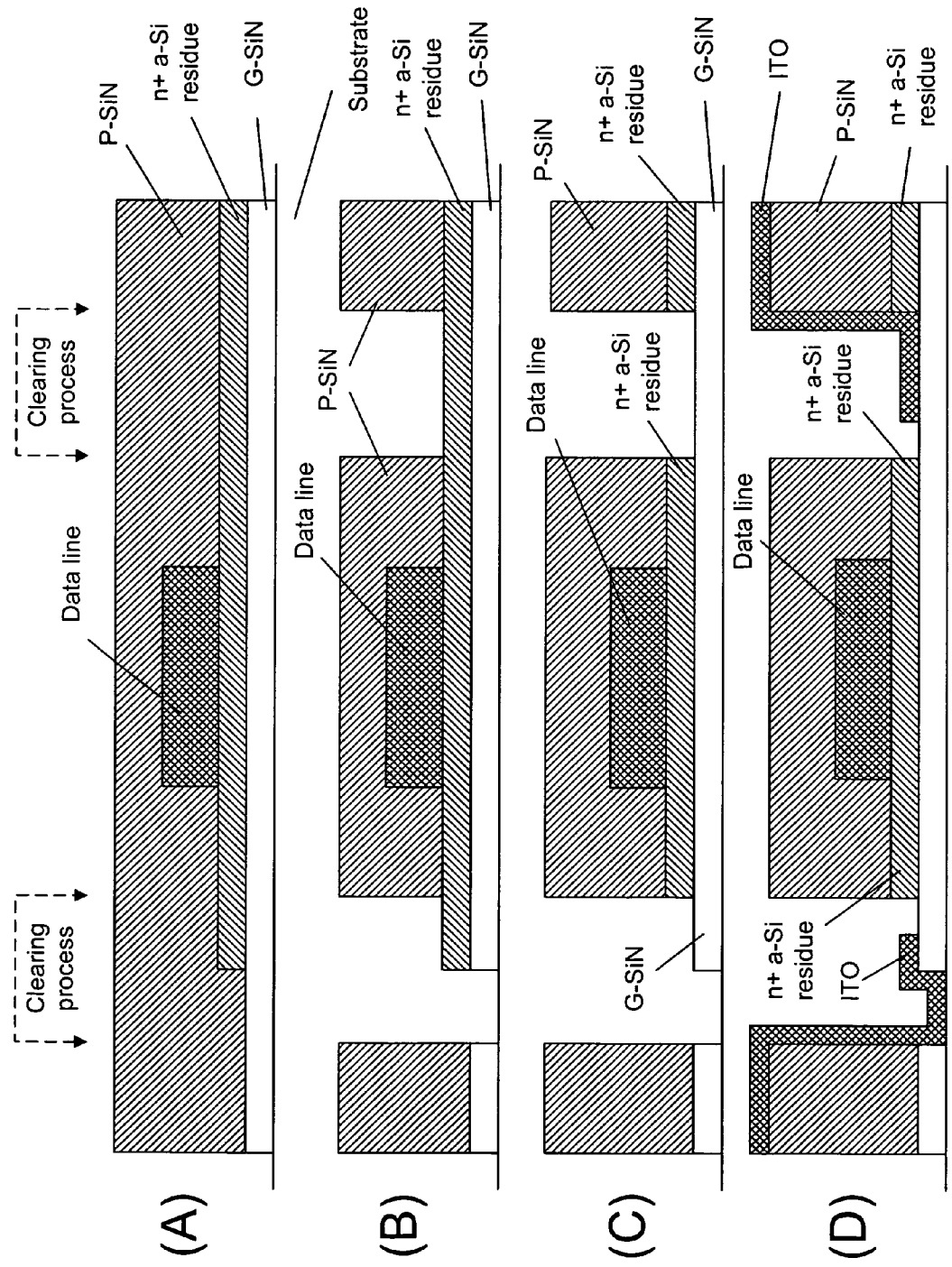
FIGS. 5A-5D show the steps in the clearing process.

Thus, the clearing and isolating process, according to the present invention, involves the etching of P-SiN and G-SiN layers in order to create a plurality of cleared areas on the substrate. The cleared areas are shown in FIG. 4 with dotted lines near the pixel electrodes which are made of ITO, for example. With one or more cleared areas near the ITO layer, unwanted electrical connections between the ITO and other conductive layers via the residue can be reduced or eliminated. As shown in FIG. 4, the cleared pattern is in the designated areas along the borders of the pixel electrodes adjacent to a gate line or data line. As illustrated in FIGS. 5A-5D, the n+ a-Si residue, which is at least semi-conductive, may land on the substrate before the data line is deposited. Without the clearing and isolation process, this residue would cause an unwanted electrical connection between the pixel electrode and the data line (see the location of the data line in relation to the pixel electrode in FIG. 1b). As shown in FIG. 5D, the pixel electrode (i.e., ITO) is deposited on a pixel area after a cleared area is created.

The clearing and isolation process, according to the present invention, starts out with depositing a P-SiN layer, covering the data line and at least part of the areas where the pixel electrodes are to be disposed, as shown in FIG. 5A. The P-SiN layer also covers at least part of the n+ a-Si residue. After the P-SiN is deposited, a clearing process is used to etch the P-SiN layer and the G-SiN layer in the designated areas, as shown in FIG. 5B. This etching process is selected such that it is effective against P-SiN and G-SiN, but not effective against a-Si. For example, a gas mixture containing fluorocarbon, for example, can be used for this purpose. It is followed by using an a-Si selective etching process to clear out the n+ a-Si residue in the designated area, as shown in FIG. 5C. Selective etching is known in art. For example, it is possible to use a fluorine or chlorine containing plasma to remove a-Si:H. Subsequently, an ITO layer is deposited over the cleared structure to form pixel electrodes. Part of the pixel electrodes may be in contact with the glass substrate. Nevertheless, the pixel electrodes are electrically separated from the remaining n+ a-Si residue and from the data line. Furthermore, it may be desirable to remove some n+ a-Si residue to create undercut areas under the P-SiN layer in order to avoid unwanted electrical contacts between the ITO layer and the data line through the n+ a-Si residue.

Figure 6:
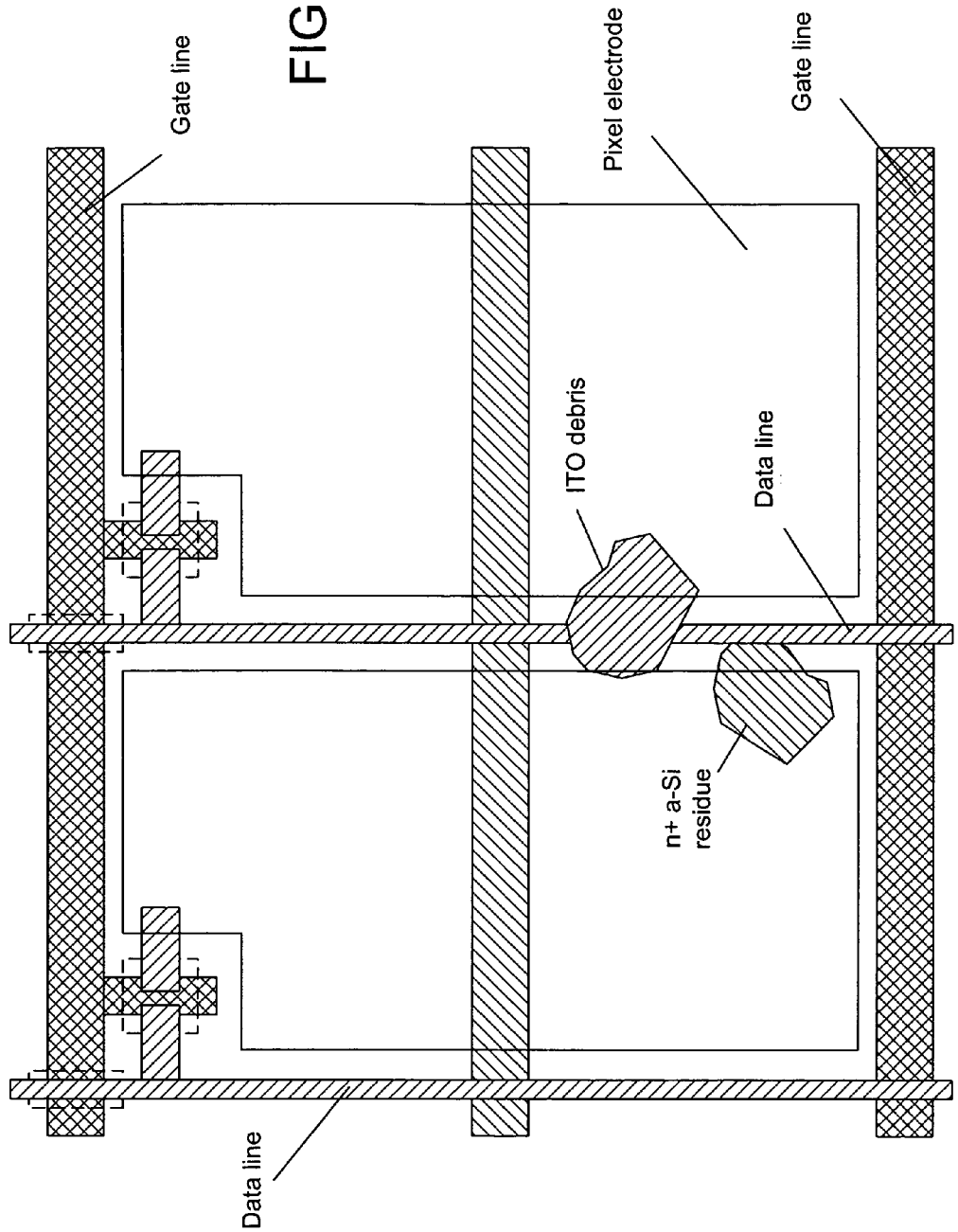
FIG. 6 is a schematic representation showing indium-tin oxide debris and an amorphous silicon residue lodged in a pixel.
Figure 7:
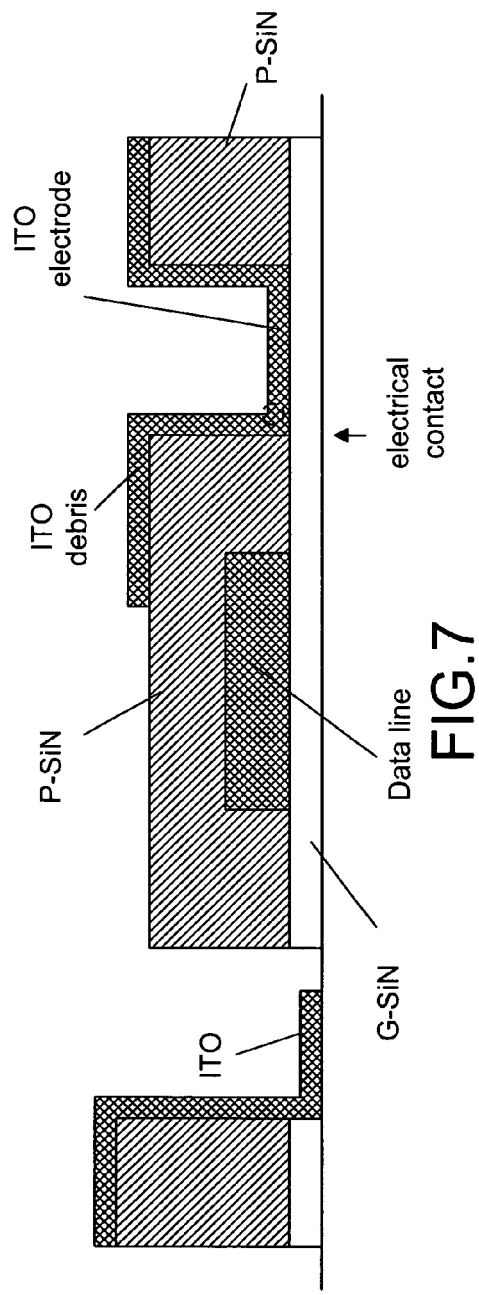
FIG. 7 illustrates how indium-tin oxide debris causes an unwanted electrical connection.

If some unwanted ITO debris are produced during the ITO deposition process and the debris extend beyond the pixel electrode area, as shown in FIG. 6, the ITO debris may cause an unwanted electrical connection between this pixel electrode and its adjacent pixel electrode or data line. In that case, the etching and isolation process as illustrated in FIGS. 5A-5D may not be effective in eliminating the unwanted electrical connection. As shown in FIG. 7, the pixel electrode may be coupled to the data line between the remaining P-SiN and G-SiN layers. For that reason, a different process must be used.

Figure 8:
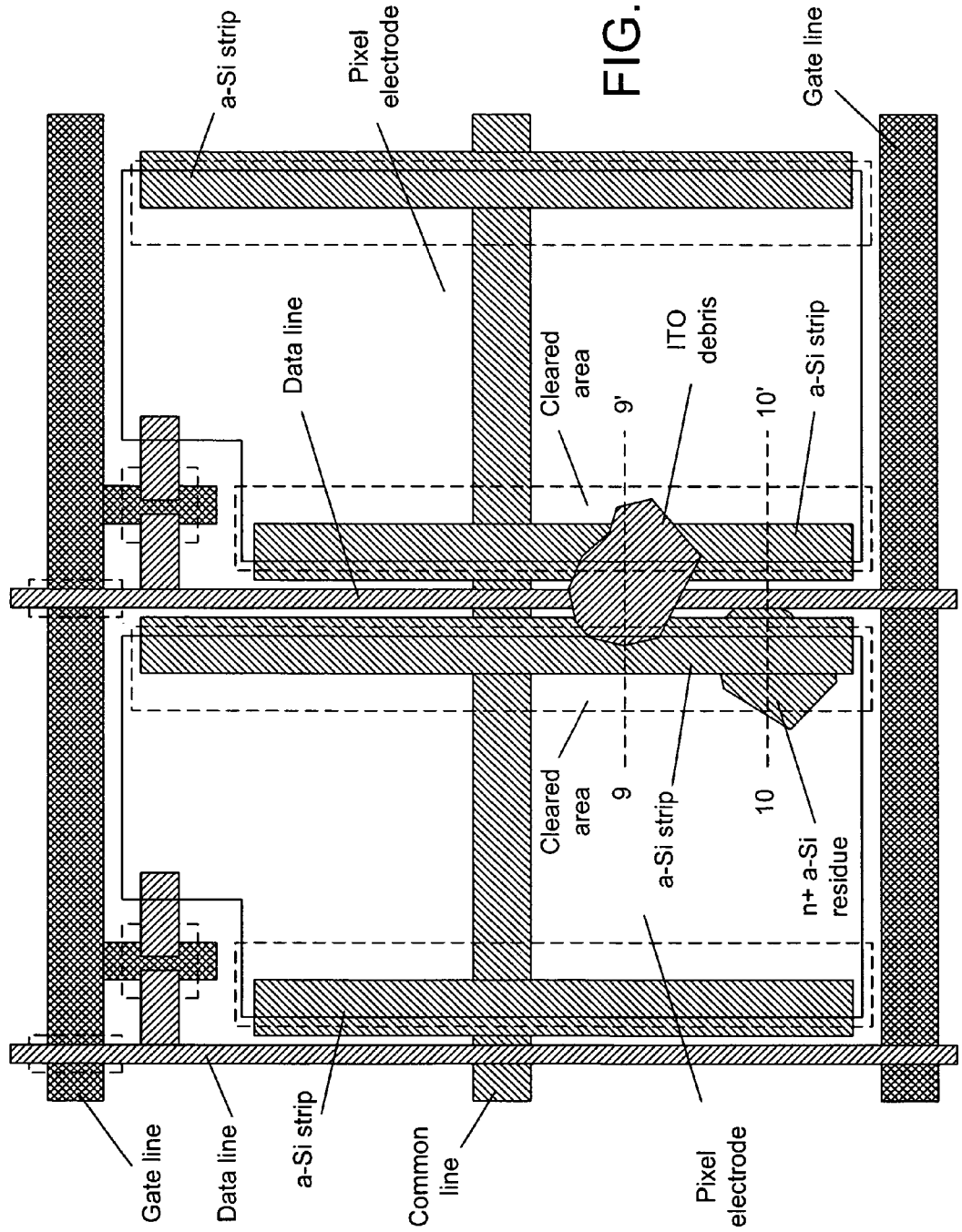
FIG. 8 illustrates another residue clearing process, according to the present invention.

The different process, according to the present invention, includes an extra step of depositing an a-Si layer in an area overlapping each of the designed areas in order to create a desirable cleared area, as shown in FIG. 8. To illustrate how the added a-Si layer works in the clearing and isolation process, the isolation of the ITO debris is shown in FIGS. 9A-9C, and the isolation of the n+ a-Si residue is shown in FIGS. 10A-10D.

This different process, according to the present invention, starts out with depositing two strips of a-Si on both sides of the data line or gate line, and a P-SiN layer covering the data line, the a-Si strips and at least part of the areas where the pixel electrodes are to be disposed, as shown in FIG. 9A. After the P-SiN layer is deposited, a dry-etching process is used to create a cleared area by removing the P-SiN layer and the G-SiN layer in the designated areas, as shown in FIG. 9B. This dry-etching process is effective against P-SiN and G-SiN, but not effective against a-Si. It is followed by using an a-Si selective etching process to clear out not only the a-Si strips in the designated area but also a part of the a-Si under the remaining P-SiN layer, as shown in FIG. 9C. Subsequently, an ITO layer is deposited over the cleared structure to form pixel electrodes, as shown in FIG. 9D. Part of the pixel electrodes may be in contact with the glass substrate. Nevertheless, even if there is a piece of unwanted ITO extended from one pixel electrode to another pixel electrode, the electrical connection is broken because of the undercut resulted from the a-Si etching.

The dry-etching process that is used to clear out a-Si strips is also effective against n+ a-Si residues, as shown in FIGS. 10A-10D. As shown in FIG. 10A, an n+ a-Si residue may land on the G-SiN layer before the data line is deposited. The clearing and isolation process, according to this embodiment of the present invention, starts out with depositing two strips of a-Si on both sides of the data line. A P-SiN layer is then deposited, covering the data line, the a-Si strips, the n+ a-Si residue, and at least part of the areas where the pixel electrodes are to be disposed. The a-Si strips are deposited on the G-SiN layer, but one of the a-Si strips may be deposited on the n+ a-Si residues where they exist. After the P-SiN layer is deposited, a dry etching process is used to create a cleared area by removing the P-SiN layer and the G-SiN layer in the designated areas, as shown in FIG. 10B. This etching process is effective against P-SiN and G-SiN, but the respective etching rates against a-Si and n+ a-Si are different. It is followed by using an a-Si selective etching process to etch out the a-Si strips and n+ a-Si residue in the designated area, as shown in FIG. 10C. Subsequently, an ITO layer is deposited over the cleared structure to form pixel electrodes, as shown in FIG. 10D. It should be noted that part of the a-Si strips and part of the n+ a-Si residue under the P-SiN layer are also etched, causing a section of the ITO layer for the pixel electrode to be broken, as shown on the left-hand side of FIG. 10D. This broken section is limited only to where the n+ a-Si residue is originally located.

Figure 1A:
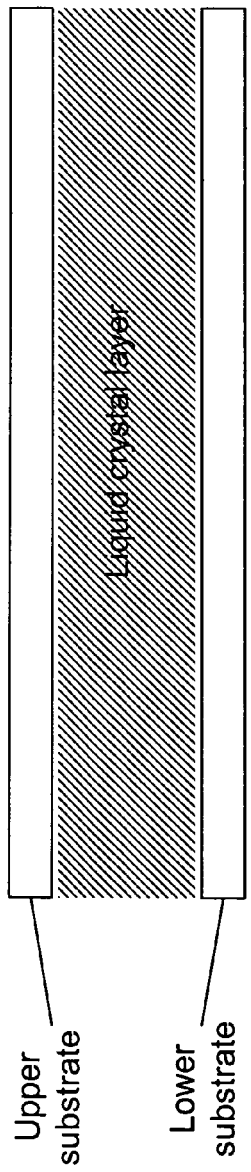
FIG. 1a is a layer structure showing a liquid crystal display.
Figure 1B:
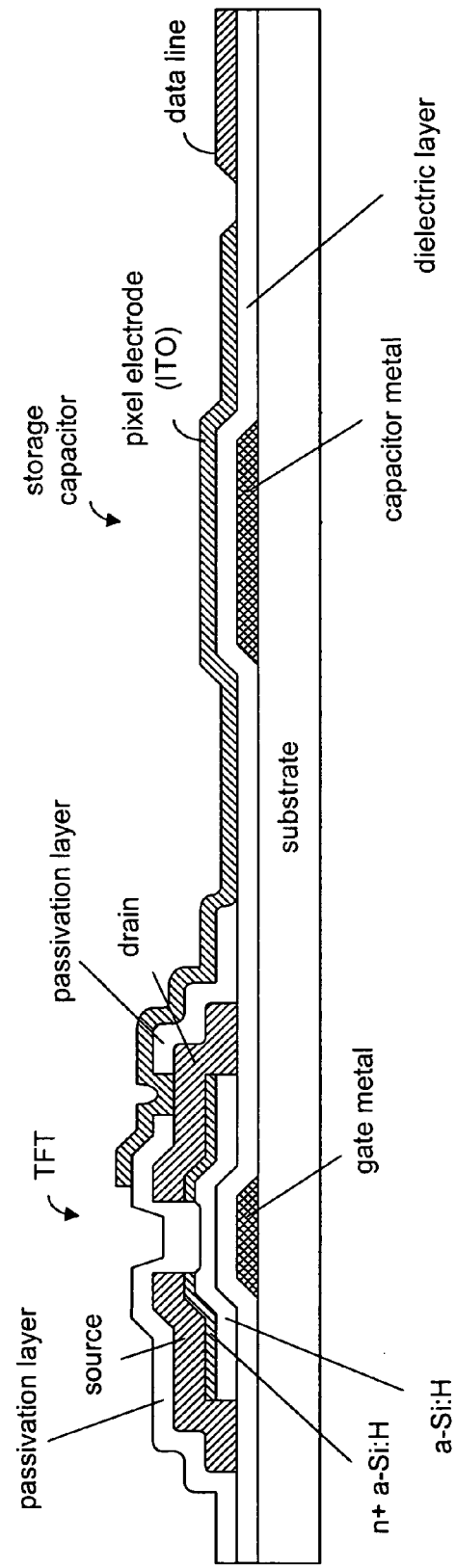
FIG. 1b shows a layered structure of a lower substrate in a pixel in a typical LCD panel.
Figure 2:
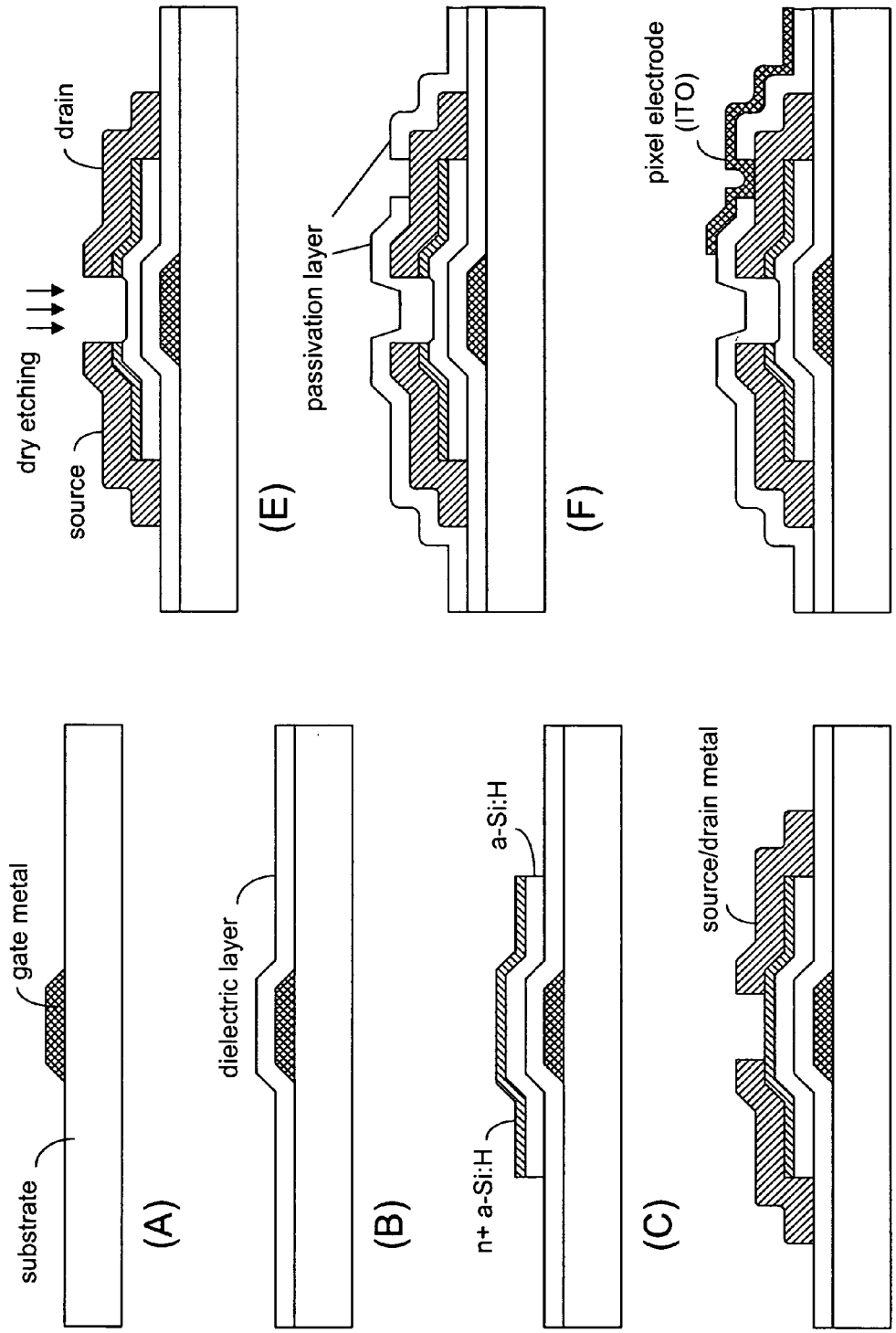
FIGS. 2A-2G show the process steps in fabricating a thin-film transistor on a glass substrate.
Figure 3:
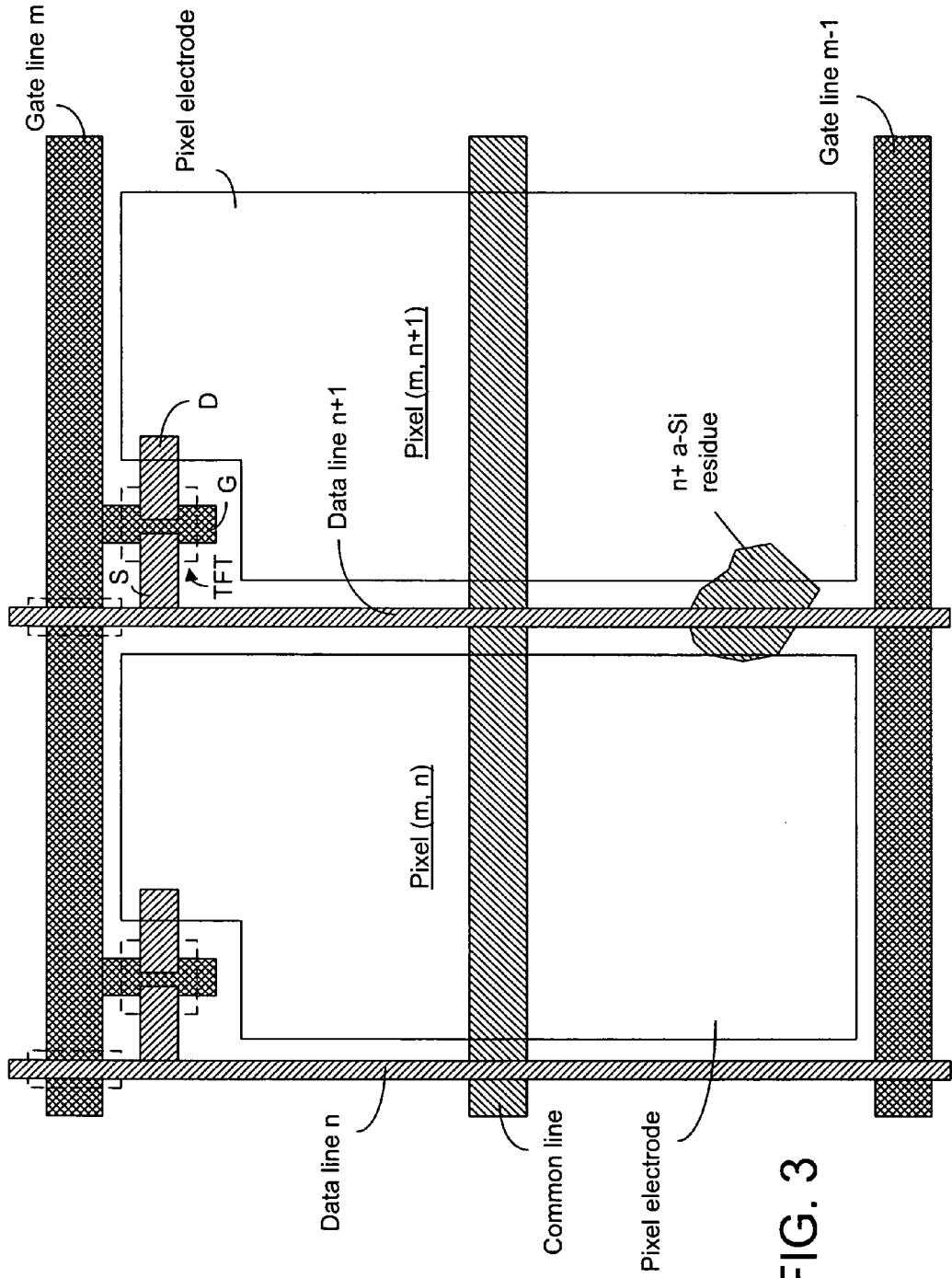
FIG. 3 is a schematic representation showing an amorphous silicon residue lodged in a pixel.
Figure 11:
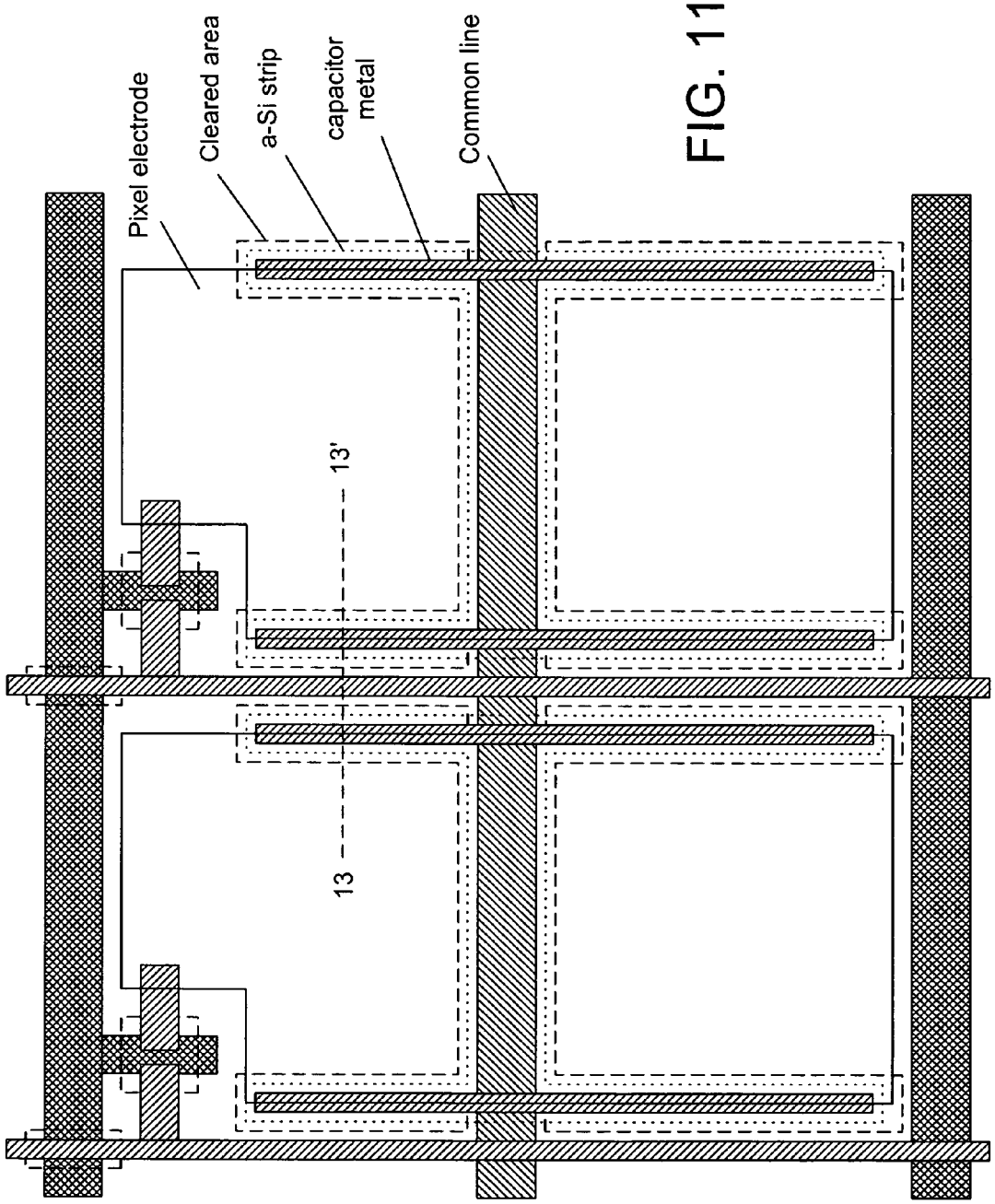
FIG. 11 is a plan view showing pixels with metal-insulator-ITO capacitors and the clearing process made on the pixels.

The residue and debris clearing and isolation processes of the present invention are also applicable to an LCD panel with pixels having metal-insulator-ITO (MII) capacitors. An example of MII capacitor (storage capacitor) is shown in FIG. 1b. The capacitor metal strip can be entirely covered by a pixel electrode, or only partially covered by the pixel electrode, as shown in FIG. 11. The clearing process applicable to pixels with an MII capacitor starts out with depositing an a-Si layer over the capacitor metal and the section of the common line metal that would be subject to etching. The amorphous silicon layer is depicted with lines with shorter dots and the cleared area is depicted with lines with longer dots, as shown in FIG. 11.

Figure 12:
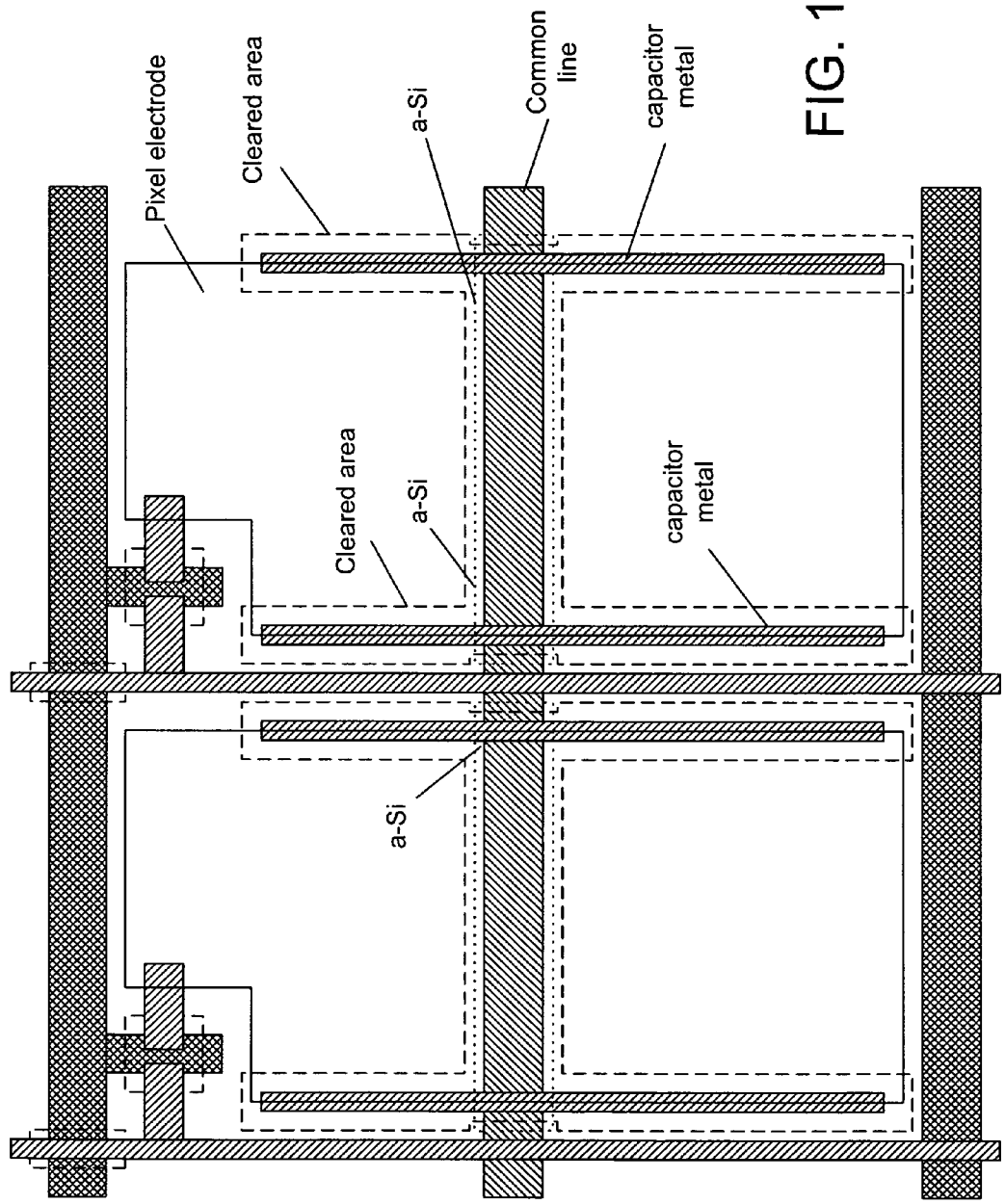
FIG. 12 is a plan view showing pixels with metal-insulator-ITO capacitors and a different clearing process.

As can be seen from FIG. 1b, the capacitor metal is protected by a dielectric layer (G-SiN). For that reason, it may not be necessary to deposit the a-Si layer on top of the capacitor metal areas if the P-SiN etching process is not effective against G-SiN. However, the a-Si layer is necessary to protect part of the common line, as shown in FIG. 12.

Figure 14:
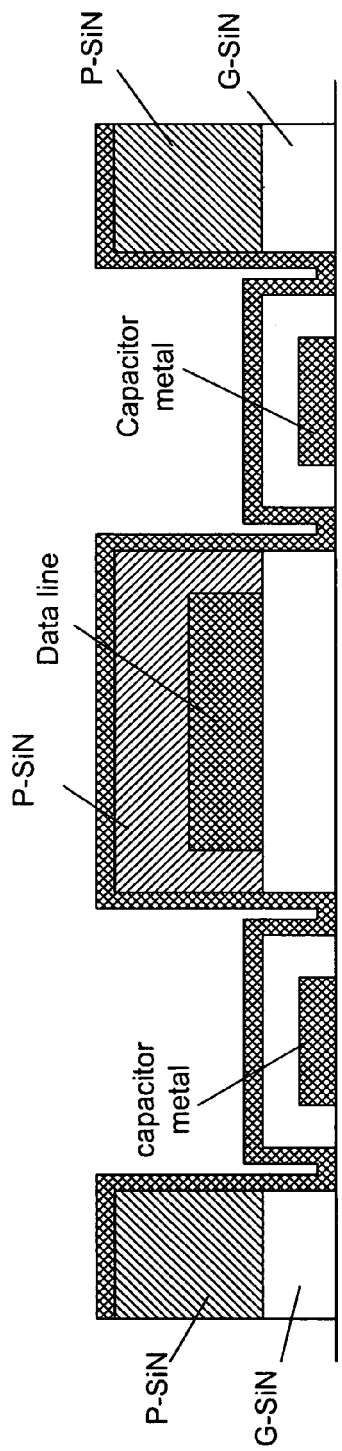
FIG. 14 illustrates how indium-tin oxide debris causes an unwanted electrical connection.
Figure 13:
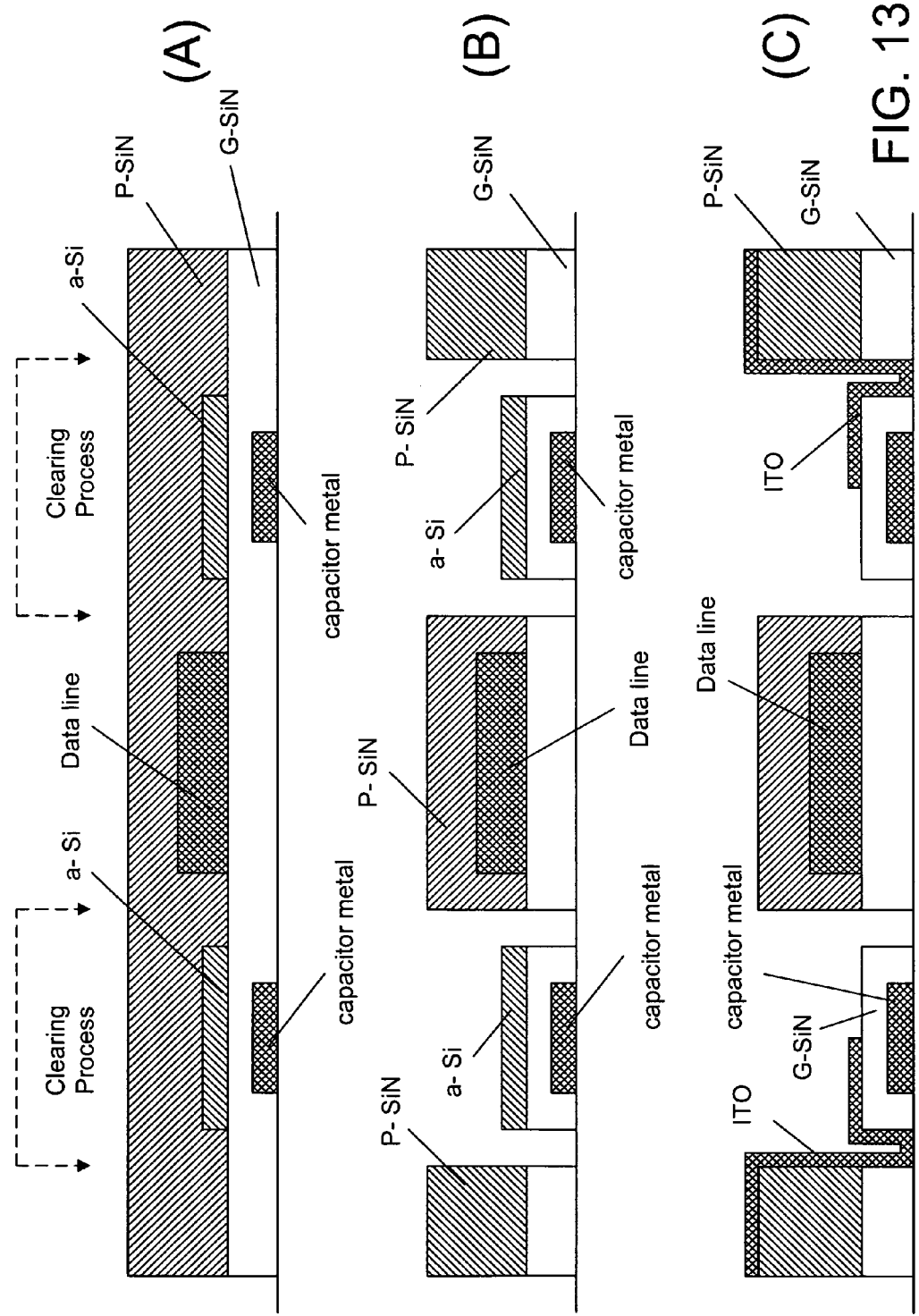
FIGS. 13A-13C illustrate the steps in the clearing process involving metal-insulator-ITO capacitors.

If the P-SiN etching process is also effective against G-SiN, then the a-Si strips must entirely cover the capacitor metal, as shown in FIGS. 13 and 14. In FIG. 13, the a-Si strip is located entirely within the cleared area, so that part of the G-SiN layer can be removed by the etching process.

Figure 9:
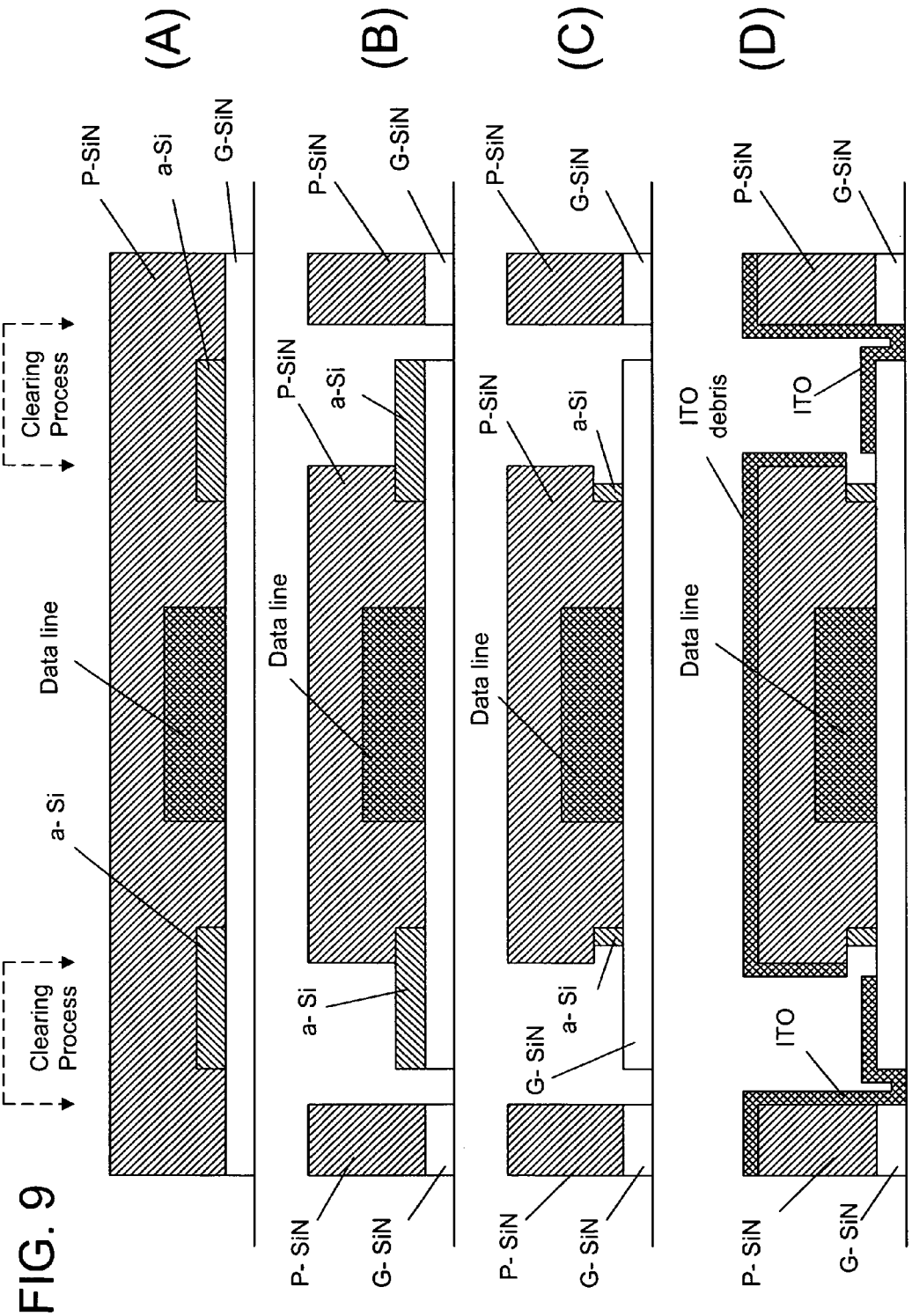
FIGS. 9A-9D show the steps in the clearing process involving indium-tin oxide debris.
Figure 10:
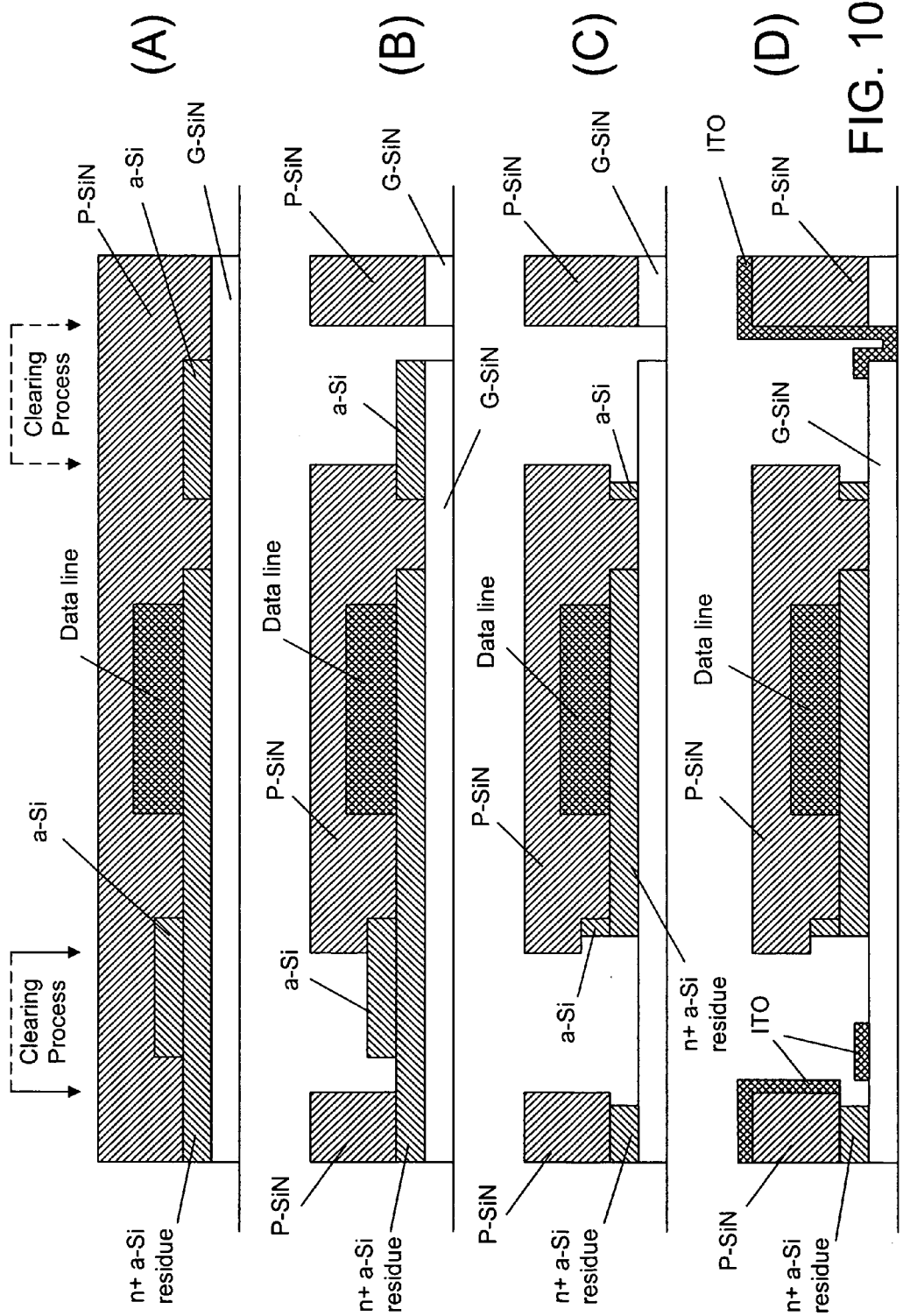
FIGS. 10A-10D show the steps in the clearing process involving amorphous silicon residues.

As with the process for clearing the n+ a-Si residues as shown in FIGS. 9 and 10, the process for clearing pixels with MII capacitors also starts out with depositing two strips of a-Si, one at each side of the gate line. A P-SiN layer is then deposited to cover the data line, the a-Si strips and at least part of the areas where the pixel electrodes are to be disposed, as shown in FIG. 13A. As shown, the a-Si strip covers entirely the capacitor metal under the G-SiN layer and the a-Si strip is located within the cleared area. After the P-SiN layer is deposited, a dry-etching process is used to clear the P-SiN layer and the G-SiN layer in the designated areas, as shown in FIG. 13B. This dry-etching process is effective against P-SiN and G-SiN, but not so effective against a-Si. It is followed by using an a-Si selective etching process to clear out the a-Si strips, as shown in FIG. 13C. Subsequently, an ITO layer is deposited over the cleared structure to form pixel electrodes. Part of the pixel electrodes may be in contact with the glass substrate. Nevertheless, the pixel electrodes are electrically isolated from the capacitor metal and the gate line metal, even when an n+ a-Si residue has landed between the adjacent pixel electrodes.

However, this clearing process cannot eliminate the unwanted electrical connection caused by ITO debris, as shown in FIG. 14.

Figure 15:
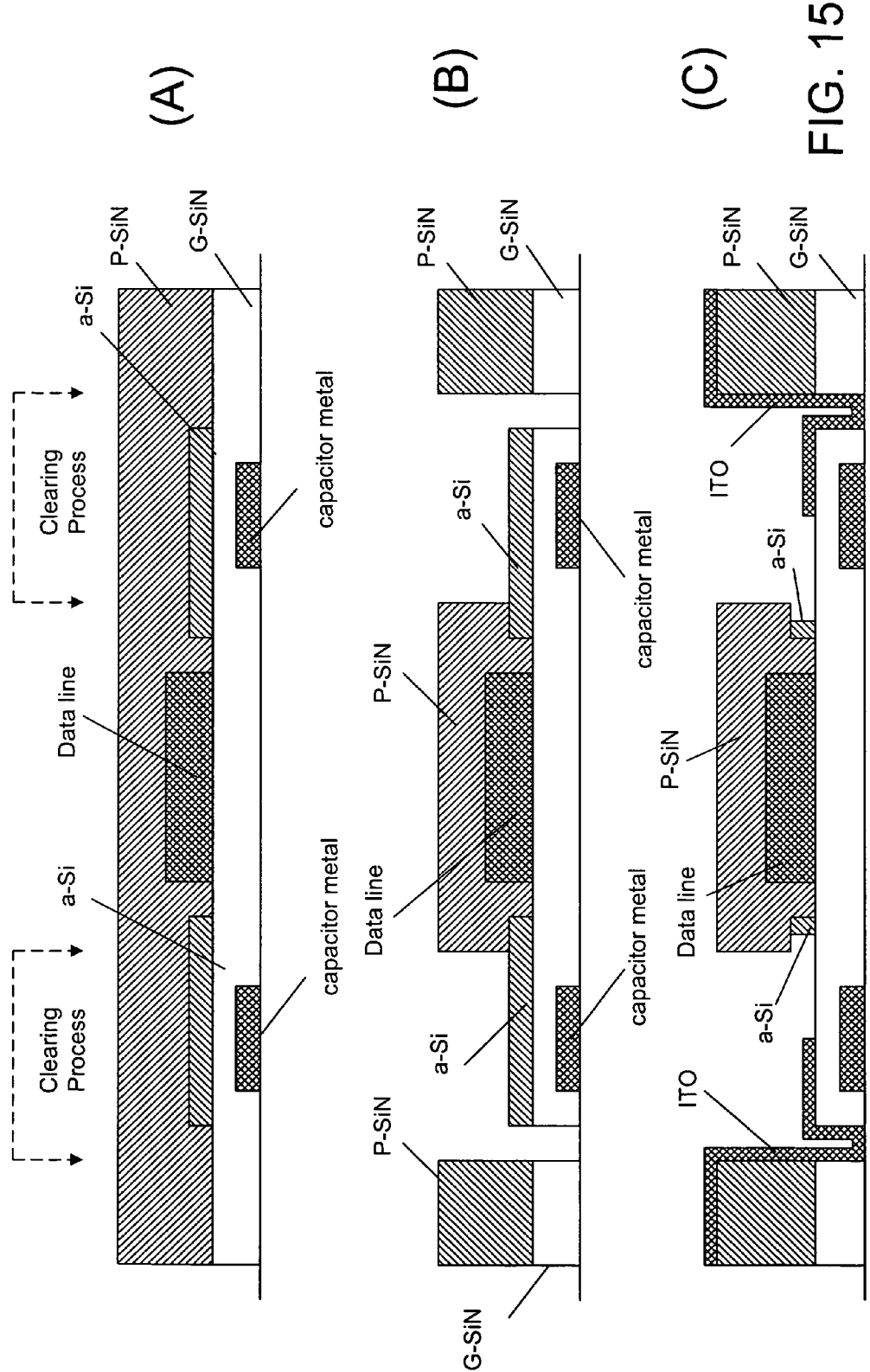
FIGS. 15A-15C illustrate the steps in a different clearing process involving metal-insulator-ITO capacitor.

In order to eliminate the ITO debris, part of the a-Si strips extends outside the cleared areas, as shown in FIGS. 15A and 15B. As such, after the P-SiN and G-SiN etching process is carried out as shown in FIG. 15A, parts of the a-Si strips are located under the P-SiN layer covering the data line metal (see FIG. 15B). After the a-Si selective etching step is carried out, two undercut areas are produced in the P-SiN layer over the data line metal, as shown in FIG. 15C. These undercut areas will cause ITO debris to be broken, similar to FIG. 9D.

In sum, the present invention provides a method for preventing unwanted electrical contacts between various electrically conducting surfaces and lines in a display panel due to an n+ a-Si residue and/or ITO debris. In general, the display panel comprises a substrate and a dielectric layer on which a plurality of pixels are fabricated. Each pixel comprises at least a signal line, a passivation layer deposited over the signal line, and an electrode disposed on a section of the passivation layer. The present invention provides a clearing pattern in at least some of the pixels, wherein the clearing pattern includes at least a cleared area in the passivation layer for preventing the residue or debris from locating at the cleared area. The cleared area separates a section of the passivation layer deposited over the signal line from at least a part of the section of the passivation layer on which the electrode is to be disposed. As such, if an n+ a-Si residue happens to be deposited under the passivation layer, the part of the residue located in the cleared area is removed by an a-Si selective etching process, for example. Furthermore, with the cleared area, ITO debris deposited on the section of the dielectric layer deposited on the signal line can be electrically isolated from the electrode. Preferably, the clearing pattern is created by a dry etching process that is effective against the dielectric layer and the passivation layer, but substantially less effective against the amorphous silicon material.

To further assure that the ITO debris does not make unwanted electrical contacts with the electrode, an a-Si strip is deposited on the pixel before the passivation layer is deposited on the signal line. This a-Si strip is designed such that after the clearing pattern is made, part of the a-Si strip is exposed in the cleared area, allowing an a-Si selective etching process to create undercut areas below a section of the passivation layer that is deposited on the signal line.

In a pixel where an electrically conductive area is deposited under the dielectric layer for use as a capacitor, the a-Si strip is designed to cover the dielectric layer above and around the electrically conductive area but the strip is narrower than the cleared area. As such, the dry etching process does not remove the dielectric layer above and around the electrically conductive area while creating two troughs along the dielectric layer above and around the electrically conductive area.

Although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for preventing an unwanted electrical contact in a display panel, wherein the display panel comprises a substrate and a plurality of pixels formed on the substrate, said method comprising:
    creating a clearing pattern in at least some of the pixels, wherein each of said at least some of the pixels comprises a signal line, a passivation layer and a pixel electrode disposed on a section of the passivation layer, the clearing pattern including at least one cleared area in the passivation layer adjacent to said section of the passivation layer, wherein said at least one cleared area is configured to separate and disconnect a first section of the passivation layer from a second section of the passivation layer for preventing electrical connection between the first section and the second section caused by an unwanted electrically conductive segment electrically connected to the pixel electrode and located between the signal line and the pixel electrode, wherein the unwanted electrically conductive segment comprises an electrically conductive layer deposited on the passivation layer, and the cleared area is dimensioned to prevent said electrically conductive layer from forming a continuous layer over the cleared area.

2. The method of claim 1, wherein the unwanted electrically conductive segment comprises a doped amorphous silicon segment located under the passivation layer, and wherein said creating comprises etching away at least part of the doped amorphous silicon segment located in the at least one cleared area.

3. The method of claim 2, wherein said creating comprises removing the passivation layer in the at least one cleared area using an agent effective against the passivation layer and substantially less effective against the doped amorphous silicon, before etching away the doped amorphous silicon segment located in the cleared area using a selective etching agent.

4. The method of claim 3, wherein the signal line is disposed between the doped amorphous silicon segment and the passivation layer, and wherein said etching comprises removing part of the doped amorphous silicon segment under the passivation layer near the cleared area.

5. The method of claim 2, wherein the signal line is disposed between the doped amorphous silicon segment and the passivation layer, and wherein the cleared area is dimensioned to prevent the unwanted electrical contact between the pixel electrode and the signal line through the doped amorphous silicon segment.

6. The method of claim 2, further comprising
    providing one or more strips of amorphous silicon between the passivation layer and the doped amorphous silicon segment, the strips are dimensioned such that the cleared area exposes only a first section of the strips of amorphous silicon and leaves a second section under the passivation layer, before the doped amorphous silicon segment located in the cleared area is etched away using a selective etching agent, wherein the selective etching agent is also effective in removing the first section and at least part of the second section of the strips of amorphous silicon.

7. The method of claim 6, wherein the pixel further comprises a dielectric layer disposed between the substrate and the passivation layer, and the doped amorphous silicon segment is located between the passivation layer and the dielectric layer and wherein the agent used for creating the cleared area is also effective against the dielectric layer.

8. The method of claim 1, wherein the pixel further comprises a dielectric layer disposed between the substrate and the passivation layer, said method further comprising;
    providing one or more strips of amorphous silicon between the passivation layer and the dielectric layer, wherein the strips are dimensioned such that the cleared area exposes only a first section of the strips of amorphous silicon, leaving a second section under the passivation layer; and
    removing the first section and at least part of the second section of the strips of amorphous silicon.

9. The method of claim 8, wherein said removing comprises using an etching agent effective against the amorphous silicon and substantially less effective against the passivation layer and the dielectric layer.

10. The method of claim 1, wherein the signal line comprises one of a gate line and a data line.

11. The method according to claim 1, wherein the signal line is located under the first section of the first section of the passivation layer and the pixel electrode is spaced from the first section of the passivation layer.

12. A process of fabricating a display panel, the display panel comprising a substrate and a plurality of pixels, said process comprising;
    providing, in each pixel, a first dielectric layer on the substrate;
    forming a signal line on the first dielectric layer;
    forming a second dielectric layer on the substrate so as to cover the signal line;

clearing an area on the second dielectric layer and at least a part of the first dielectric layer for providing a cleared area, the cleared area configured to separate a first section of the second dielectric layer and a second section of the second dielectric layer, wherein the signal line is located under the first section; and forming a pixel electrode on at least part of the second section of the second dielectric layer, such that at least part of the cleared area is adjacent to the pixel electrode, wherein the pixel electrode is spaced from the first section of the second dielectric layer.

13. The process of claim 12, further comprising:
providing one or more strips of amorphous silicon between the first and second dielectric layers adjacent to the signal line, wherein the strips of amorphous silicon are dimensioned such that the cleared area exposes only a first part of the strips of amorphous silicon and leaves a second part of the strips of amorphous silicon under the second dielectric layer, and removing the first part of the strips of amorphous silicon and at least part of the second part of the strips of amorphous silicon.

14. The process of claim 12, further comprising
providing one or more electrically conductive segments between the substrate and the first dielectric layer; and
providing one or more strips of amorphous silicon between the first and second dielectric layers, wherein each of the strips of amorphous silicon is dimensioned to cover a portion of the first dielectric layer over one of said electrically conductive segments, and said at least part of the first dielectric layer in the cleared area comprises sections of the first dielectric layer adjacent to said portion.

15. The process of claim 12, wherein the display panel is a liquid crystal display panel, said process further comprising
providing a liquid crystal layer over the second dielectric layer; and
providing a further substrate over the liquid crystal layer.

16. The process of claim 12, wherein the cleared area is configured to expose part of the substrate.

17. A display panel comprising:
a substrate; and
a plurality of pixels formed on the substrate, each of the pixels comprising
a first dielectric layer,
a signal line disposed on the first dielectric layer,
a second dielectric layer disposed on the signal line and part of the first dielectric layer,
a pixel electrode disposed on part of the second dielectric layer, and
a clearing pattern provided in at least some of the pixels, wherein the clearing pattern includes at least one cleared area to clear part of the second dielectric layer for separating a first section of the second dielectric layer covering the signal line from a second section of the second dielectric layer on which the pixel electrode is disposed so as to prevent electrical connection between the first section and the second section caused by an unwanted electrically conductive segment electrically connected to the pixel electrode and located between the pixel electrode and the signal line, wherein the pixel electrode is spaced from the first section of the second dielectric layer.

18. The display panel of claim 17, wherein each of the pixels further comprises one or more electrically conductive segments between the substrate and the first dielectric layer, and the clearing pattern also includes removed areas in the first dielectric layer on both sides of each electrically conductive segment, and wherein the removed areas in the first dielectric layer are located within the cleared area.

19. A liquid crystal display comprising the display panel of claim 17.

20. A method for preventing an unwanted electrical contact in a display panel, wherein the display panel comprises a substrate and a plurality of pixels formed on the substrate, said method comprising:
creating a clearing pattern in at least some of the pixels, wherein each of said at least some of the pixels comprises a. signal line, a dielectric layer, a passivation layer and a pixel electrode disposed on a section of the passivation layer, the clearing pattern including at least one cleared area in the passivation layer, wherein said at least one cleared area is dimensioned to expose a portion of a top surface of the dielectric layer, and to separate a first section of the passivation layer from a second section of the passivation layer for preventing electrical connection between the first section and the second section caused by an unwanted electrically conductive segment located between the signal line and the pixel electrode, wherein the pixel electrode is disposed on the second section of the passivation layer and on at least part of the top surface of the dielectric layer, and wherein the unwanted electrically conductive segment comprises a doped amorphous silicon segment located under the passivation layer, and wherein said creating comprises etching away at least part of the doped amorphous silicon segment located in the at least one cleared area.

21. The method of claim 20, further comprising:
providing one or more strips of amorphous silicon between the passivation layer and the dielectric layer, wherein the strips are dimensioned such that the cleared area exposes only a first section of the strips of amorphous silicon, leaving a second section under the passivation layer; and
removing the first section and at least part of the second section of the strips of amorphous silicon.

22. The method of claim 21, wherein said removing comprises using an etching agent effective against the amorphous silicon and substantially less effective against the passivation layer and the dielectric layer.

23. A method for preventing an unwanted electrical contact in a display panel, wherein the display panel comprises a substrate and a plurality of pixels formed on the substrate, said method comprising:
creating a clearing pattern in at least some of the pixels, wherein each of said at least some of the pixels comprises a signal line, a dielectric layer, a passivation layer and a pixel electrode disposed on a section of the passivation layer, the clearing pattern including at least one cleared area in the passivation layer, wherein said at least one cleared area is dimensioned to expose a portion of a top surface of the dielectric layer, and to separate a first section of the passivation layer from a second section of the passivation layer for preventing electrical connection between the first section and the second section caused by an unwanted electrically conductive segment located between the signal line and the pixel electrode, wherein the signal line is located under the first section of the passivation layer, and the pixel electrode is disposed on at least part of the second section of the passivation layer, wherein the pixel electrode is spaced from the first section of the passivation layer, wherein the unwanted electrically conductive segment comprises an electrically conductive layer deposited on the passivation layer, and the cleared area is dimensioned to prevent said electrically conductive layer from forming a continuous layer over the cleared area.

24. The method of claim 23, wherein the unwanted electrically conductive segment further comprises a doped amorphous silicon segment located under the passivation layer, and wherein said creating comprises etching away at least part of the doped amorphous silicon segment located in the at least one cleared area, wherein said creating comprises removing the passivation layer in the at least one cleared area using an agent effective against the passivation layer and substantially less effective against the doped amorphous silicon, before etching away the doped amorphous silicon segment located in the cleared area using a selective etching agent.

25. The method of claim 24, further comprising
providing one or more strips of amorphous silicon between the passivation layer and the doped amorphous silicon segment, the strips are dimensioned such that the cleared area exposes only a first section of the strips of amorphous silicon and leaves a second section under the passivation layer, before the doped amorphous silicon segment located in the cleared area is etched away using a selective etching agent, wherein the selective etching agent is also effective in removing the first section and at least part of the second section of the strips of amorphous silicon.

* * * * *